US006734604B2

(12) United States Patent
Butler et al.

(10) Patent No.: US 6,734,604 B2
(45) Date of Patent: May 11, 2004

(54) MULTIMODE SYNTHESIZED BEAM TRANSDUCTION APPARATUS

(75) Inventors: John L. Butler, Cohasset, MA (US); Alexander L. Butler, Milton, MA (US)

(73) Assignee: Image Acoustics, Inc., Cohasset, MA (US)

( * ) Notice: Subject to any disclaimer, the term of this patent is extended or adjusted under 35 U.S.C. 154(b) by 162 days.

(21) Appl. No.: 10/163,187

(22) Filed: Jun. 5, 2002

(65) Prior Publication Data

US 2003/0227826 A1 Dec. 11, 2003

(51) Int. Cl.$^{7}$ .......................................... H01L 41/08
(52) U.S. Cl. ...................... 310/334; 310/366; 310/369
(58) Field of Search ............................ 310/321, 322, 310/334, 337, 366, 311

(56) References Cited

U.S. PATENT DOCUMENTS 3,378,814 A 4/1968 Butler
3,845,333 A * 10/1974 Holloway ................... 310/322
3,924,259 A 12/1975 Butler
4,326,275 A 4/1982 Butler
4,438,509 A 3/1984 Butler et al.
4,443,731 A 4/1984 Butler et al.
4,642,802 A 2/1987 Pozzo
4,742,499 A 5/1988 Butler
4,754,441 A * 6/1988 Butler ......................... 367/157
4,845,688 A 7/1989 Butler
4,864,548 A 9/1989 Butler
5,047,683 A 9/1991 Butler et al.
5,081,391 A * 1/1992 Owen .......................... 310/334
5,184,332 A 2/1993 Butler
5,742,561 A 4/1998 Johnson
6,465,936 B1 10/2002 Knowles et al.
6,643,222 B2 * 11/2003 Osborn et al. .............. 367/174

OTHER PUBLICATIONS

"Multimode Directional Telesonar Transducer" by Butler et al Proc. IEEE Oceans, v2, 1289–1292 (2000).

* cited by examiner

*Primary Examiner*—Mark Budd
(74) *Attorney, Agent, or Firm*—David M. Driscoll

(57) ABSTRACT

An electro-mechanical transducer, which provides beam patterns synthesized from the vibration modes of the transducer. A preferred form of the transducer is a short piezoelectric tube or ring with separate electrodes spaced around the ring for specific excitation of the monopole, dipole and quadrupole modes of vibration. Operation of the transducer in the region between the dipole and quadrupole modes yields a system with a nearly constant beam pattern and transmitting response. The arrangement allows a simple directional steered beam pattern from a single transducer.

31 Claims, 10 Drawing Sheets

| | 1 | 2 | 3 | 4 |
|---|---|---|---|---|
| Omni | 1 | 1 | 1 | 1 |
| Dipole | 1 | 1 | -1 | -1 |
| Quad | 1 | -1 | -1 | 1 |
| Optimal | 1.5 | 1.9 | 0.5 | 0.1 |

| | 1 | 2 | 3 | 4 |
|---|---|---|---|---|
| Omni | 1 | 1 | 1 | 1 |
| Dipole | 1 | 1 | -1 | -1 |
| Quad | 1 | -1 | -1 | 1 |
| Optimal | 1.5 | 1.9 | 0.5 | 0.1 |

| Electrode | 15 kHz | | 17.5 kHz | | 20 kHz | | Optimal | |
|---|---|---|---|---|---|---|---|---|
| | Real | Imag | Real | Imag | Real | Imag | Real | Imag |
| 1 | -0.2 | 0.1 | 0.8 | 0.0 | 1.3 | 0.0 | 1.5 | 0.0 |
| 2 | 2.4 | -0.5 | 2.0 | -0.2 | 1.8 | -0.1 | 1.9 | 0.0 |
| 3 | 2.2 | -0.1 | 1.2 | 0.0 | 0.7 | 0.0 | 0.5 | 0.0 |
| 4 | -0.4 | 0.5 | 0.0 | -0.2 | 0.2 | 0.1 | 0.1 | 0.0 |
| sum | 4.0 | 0.0 | 4.0 | 0.0 | 4.0 | 0.0 | 4.0 | 0.0 |

FIG 9

MULTIMODE SYNTHESIZED BEAM TRANSDUCTION APPARATUS

This invention was made with U.S. Government support under contract no. N00014-00-C-0186 awarded by the Office of Naval Research. The Government has certain rights in this invention.

BACKGROUND OF THE INVENTION

1. Field of the Invention

The present invention relates in general to transducers, and more particularly to acoustic transducers and transducer arrays. The present invention also relates to a transducer capable of radiating steered directional acoustic energy from a single transducer.

2. Background and Discussion

Traditionally arrays of sonar transducer are used to form directional beams that can be electronically steered to various directions. They often take the form of planar, spherical or cylindrical arrays. U.S. Pat. No. 3,290,646, "Sonar Transducer," by S. L. Ehrlich and P. D. Frelich describes an invention where beams are formed and steered from one transducer in the form of a cylinder. Cardioid beam patterns are formed through the combination of extensional monopole and dipole modes of vibration of a piezoelectric tube, cylinder or ring. Ehrlich has also described a spherical type transducer device in U.S. Pat. No. 3,732,535. The cardioid beam pattern function yields beam widths that are rather broad with a value of approximately 131°, limiting the degree of localization.

It is the general object of the present invention to provide a transduction apparatus, which employs multiple modes to obtain an improved more directional steered beam pattern.

Another object of the present invention is to provide a transduction apparatus, which employs multiple modes including the quadrupole mode to obtain an improved, more directional, steered beam pattern.

Still another object of the present patent is to provide a constant beam pattern and smooth response over a broadband operating range.

A further object of the invention is to provide a simply excited beam with operation in the range between the dipole and quadrupole modes.

SUMMARY OF THE INVENTION

To accomplish the foregoing and other objects, features and advantages of the invention there is provided an improved electromechanical transduction apparatus that employs a means for utilizing the electromechanical transducer in a way so that higher order modes of vibration are excited in a controlled prescribed manner so as to yield a directional beam pattern.

In accordance with the invention there is provided an electromechanical transduction apparatus that is comprised of a continuous piezoelectric shell or tube with electrodes arranged to excite modes of vibration which can be combined to obtain an improved directional pattern. The combination can result from a specification of the voltages on the electrodes and can yield a uniform broadband response.

The transducer system may be of piezoelectric, electrostrictive, single crystal or magnetostrictive material operated in the 33 or 31 drive modes and typically takes the form of a ring, cylinder or spherical shell operating in extensional modes of vibration. However, inextensional modes of vibration, such as bender shell modes, may also be used to achieve directional patterns and allow a more compact lower frequency transducer system.

In one embodiment of the invention a piezoelectric cylinder is driven into its first three extensional modes by means of eight electrode surfaces. In another embodiment the modes are excited by sixteen groups of piezoelectric bars, which together constitute the ring or cylinder.

As a reciprocal device the transducer may be used as a transmitter or a receiver and may be used in a fluid, such as water, or in a gas, such as air.

BRIEF DESCRIPTION OF THE DRAWINGS

Numerous other objectives, features and advantages of the invention should now become apparent upon reading of the following detailed description taken in conjunction with the accompanying drawings, in which:

FIG. 9 shows a table of real and imaginary voltages for the cylinder of FIG. 8.

DETAILED DESCRIPTION

Figure 1B:
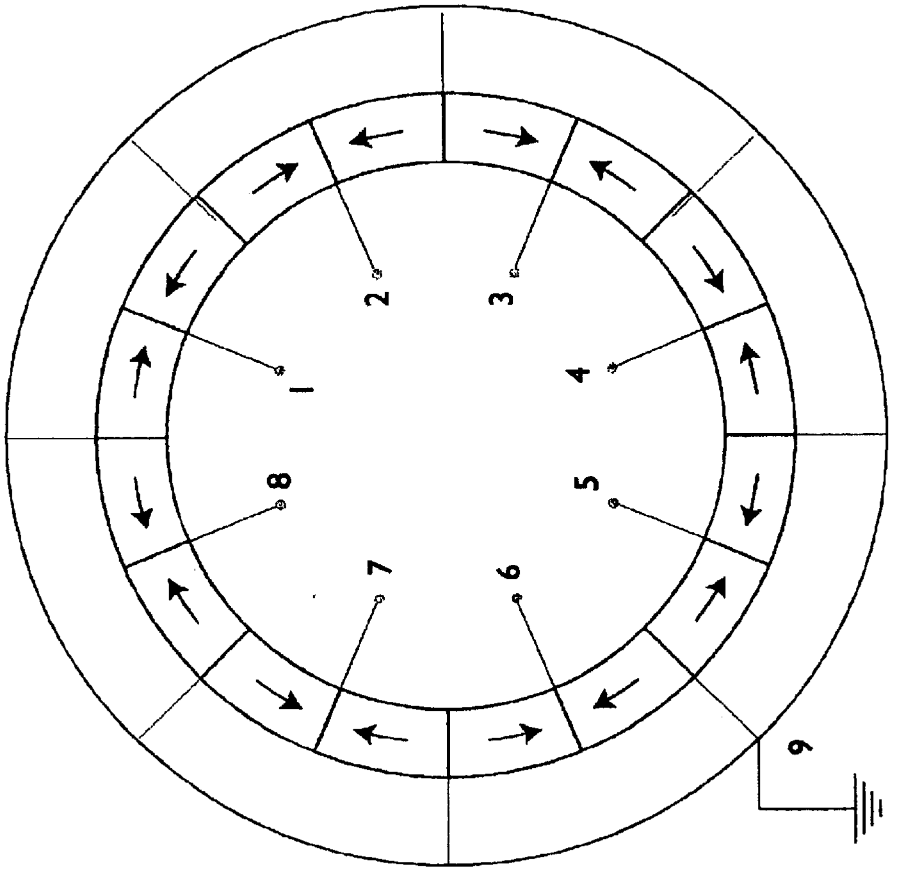
FIG. 1B schematically illustrates a piezoelectric cylinder or ring showing eight electrical connections and operated in the 33 mode with arrows showing the direction of polarization.
Figure 1A:
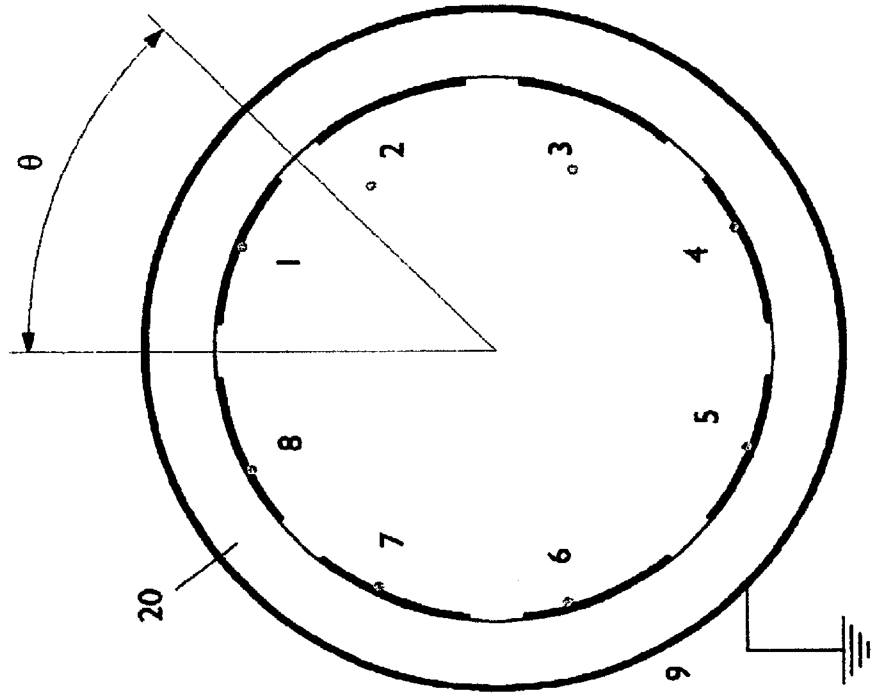
FIG. 1A schematically illustrates a piezoelectric cylinder or ring showing eight electrical connections and operated in the 31 mode.
Figure 2C:
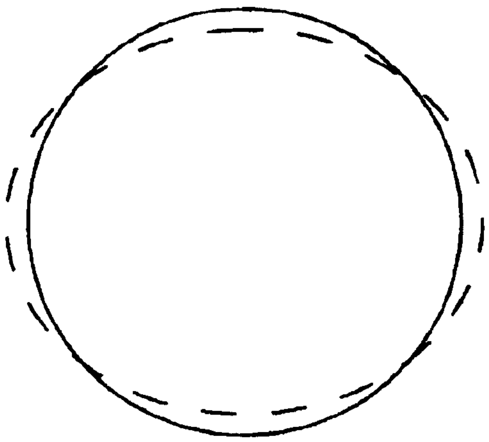
FIGS. 2A, 2B, and 2C, respectively illustrate the first three modes of vibration, namely the omni, dipole, and quadrupole, for the cylinder of FIG. 1A.
Figure 2B:
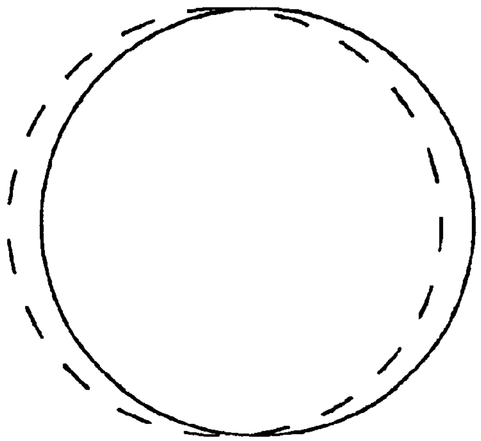
Figure 2A:
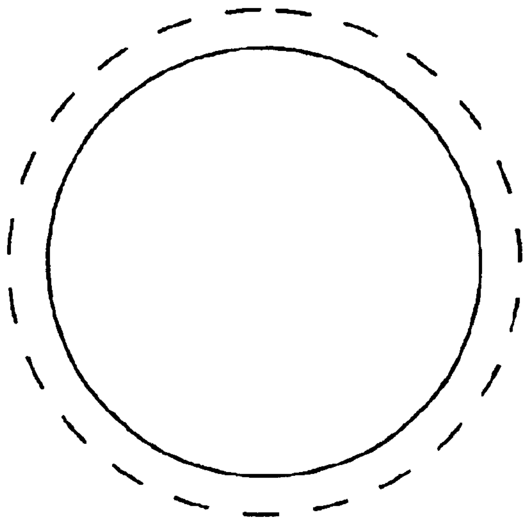

In accordance with the present invention, there is now described herein embodiments for practicing the invention. Reference is made to FIG. 1A which shows a piezoelectric cylinder 20 operating in the 31 mode with a complete electrode 9 on the outside and eight separately drivable and respective electrodes, 1, 2, 3, 4, 5, 6, 7, 8 on the inside of the cylinder 20. An alternative 33 mode arrangement is illustrated in FIG. 1B employing 16 electrodes, driven in pairs, as illustrated. Connection of all eight electrodes together in-phase, as illustrated in FIG. 1A, yields the omni or breathing mode with displacement illustrated in FIG. 2A resulting in the omni-directional beam pattern of FIG. 3A. The modes of vibration are successive vibrational shapes of the ring or cylinder. These modes move with greatest motion at their respective associated resonant frequencies.

The free fundamental resonant frequency for the omni mode is given by $f_0=C/\pi D$ where C is the sound speed in the ring or cylinder of mean diameter D. The higher order extensional modes of order n are given by $f_n=f_0\ (1+n^2)^{1/2}$. The first higher order occurs at $f_1=f_0\sqrt{2}$ and can be obtained and excited by connecting electrodes 1, 2, 7, 8 together and connecting electrodes 3, 4, 5, 6 together but opposite in phase to the first group of electrodes 1, 2, 7, 8. The result is a dipole mode of vibration illustrated in FIG. 2B with a resulting beam pattern shown in FIG. 3B. The next mode $f_2=f_0\sqrt{5}$ can be obtained and excited by connecting electrodes 1, 8, 4, 5 together and separately electrodes 2, 3, 6, 7 together but opposite in phase with the first group of electrodes 1, 8, 4, 5. The result is the quadrupole mode of vibration show in FIG. 2C with the resulting quad beam pattern shown in FIG. 3C. The corresponding beam pattern functions, F(θ), for the patterns of FIGS. 3A, 3B, and 3C may be written as F(θ)=1, F(θ)=cos(θ) and F(θ)=cos(2θ), respectively, wherein the beam pattern angle θ is as shown in FIG. 1A.

Figure 3C:
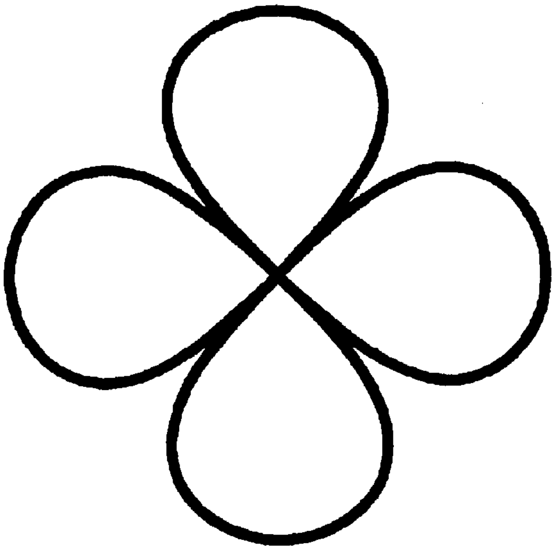
FIGS. 3A, 3B, and 3C, respectively show the omni, dipole, and quadrupole, beam patterns.
Figure 3B:
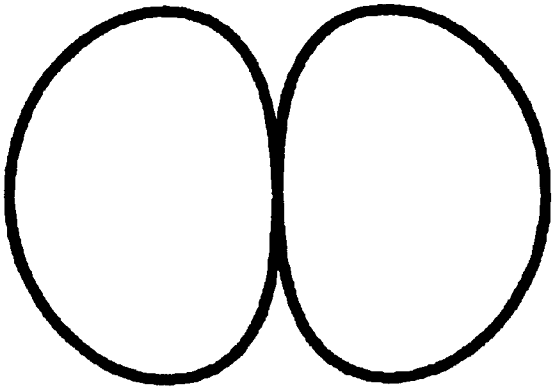
Figure 3A:
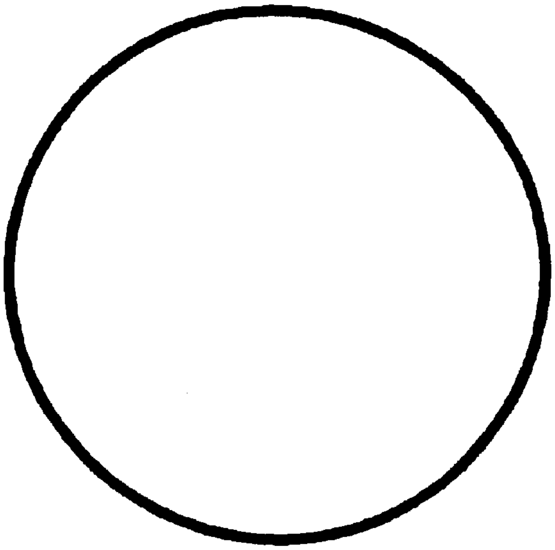

The beam patterns shown in FIGS. 3A–3C may be combined together to form various desirable patterns according to the general normalized beam pattern function formula:

$$P(\theta)=[1+A\cos(\theta)+B\cos(2\theta)]/[1+A+B] \quad \text{Eq. (1)}$$

Where: A=dipole weighting factor, and B=quadrupole weighting factor

Figure 4C:
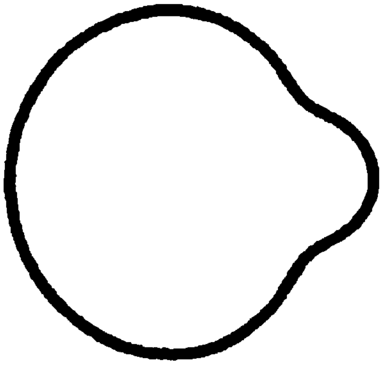
FIGS. 4A, 4B, and 4C show, respectively cardioid, super cardioid, and minimalist super cardioid, beam patterns.
Figure 4B:
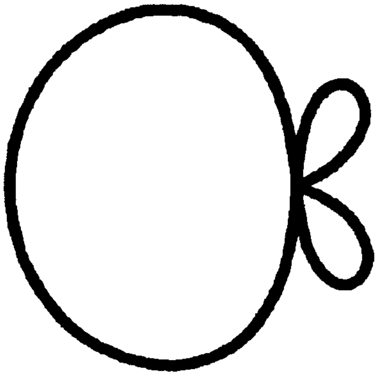
Figure 4A:
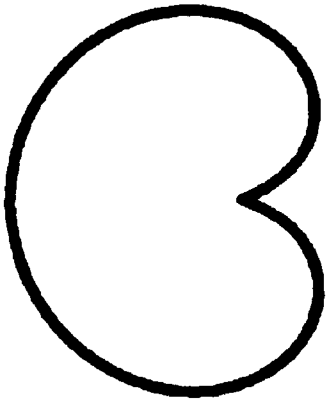

The cardioid pattern of FIG. 4A is obtained without the quadrupole mode being activated, and with B=0 and A=1. The highly directional super cardioid beam pattern of FIG. 4B is obtained for A=2 and B=1 while the minimalist super cardioid pattern of FIG. 4C is obtained for A=1 and B=0.414. This minimalist super cardioid pattern is ideal for some applications in that it achieves a beam width equal to 90° and a front to back ratio of 15 dB while using minimum weighting of the two higher modes.

Figure 5:
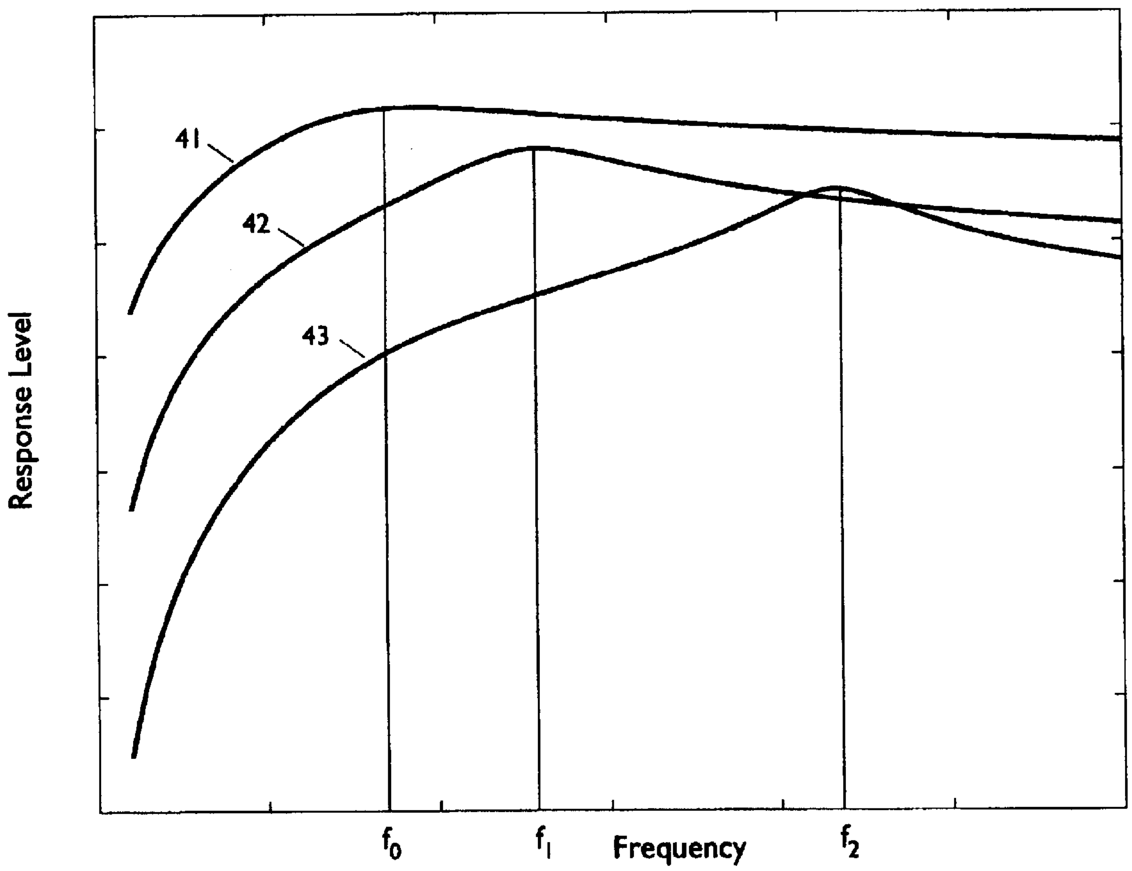
FIG. 5 shows the transmitting response for the three separate modes of vibration.
Figure 6:
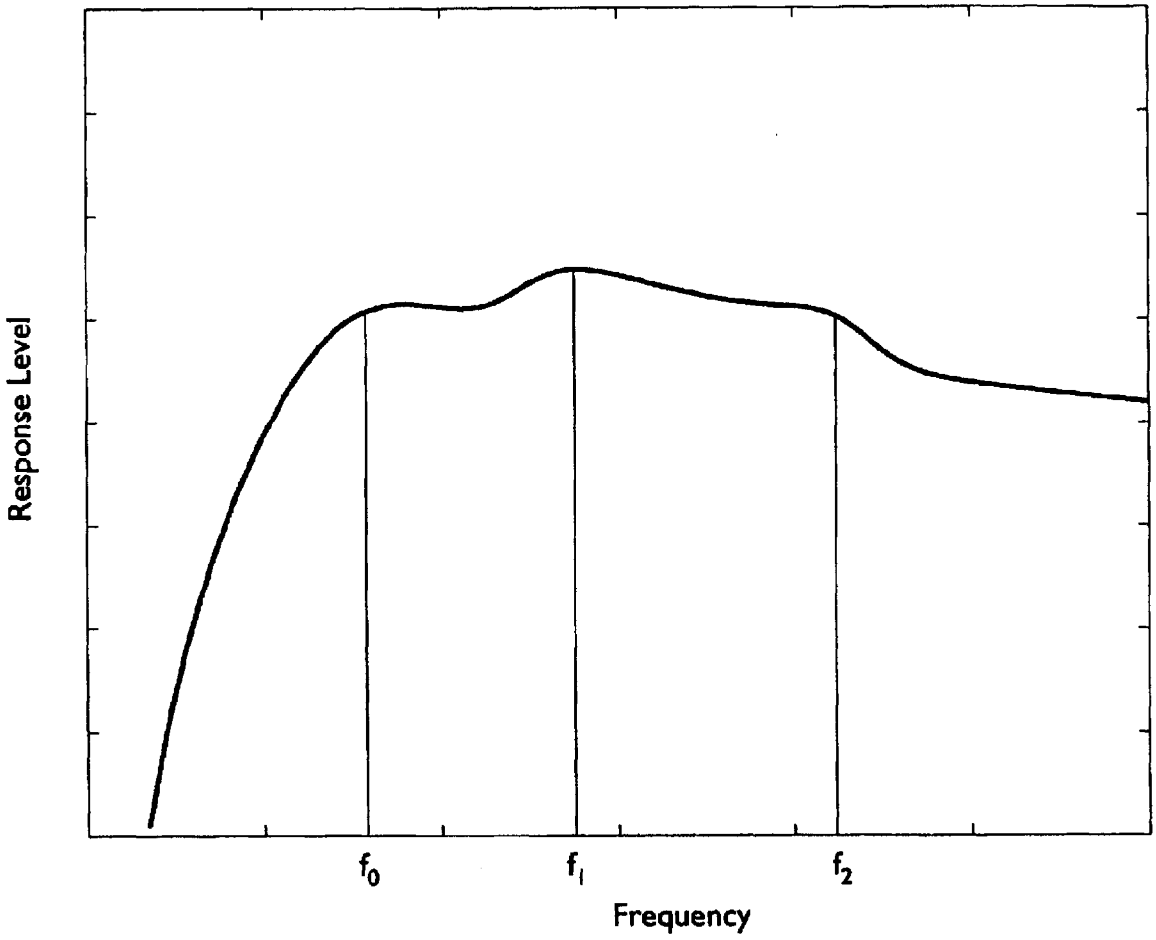
FIG. 6 shows the transmitting response of the combined modes, which produce the beam pattern of FIG. 4C.

The transmitting response for each individual mode, separately excited, is shown in FIG. 5 while the transmitting response with the modes simultaneously excited can take the form of FIG. 6 where the resonant frequencies $f_0$, $f_1$ and $f_2$ refer to the omni, dipole and quadrupole modes, respectively. In FIG. 5 curve 41 shows the transmitting response for the omni mode, curve 42 for the dipole mode, and curve 43 for the quadrupole mode, respectively.

It has been discovered that operation between the dipole and quadrupole resonant frequencies, namely between the resonant frequencies $f_1$ and $f_2$ is particularly desirable as it allows a simple means of excitation of a desirable beam pattern and improved transmitting response. This preferred operation causes vibrations at frequencies between the dipole and quadrupole resonant frequencies. This aspect of the invention and the means for achieving it are now explained.

Figure 7:
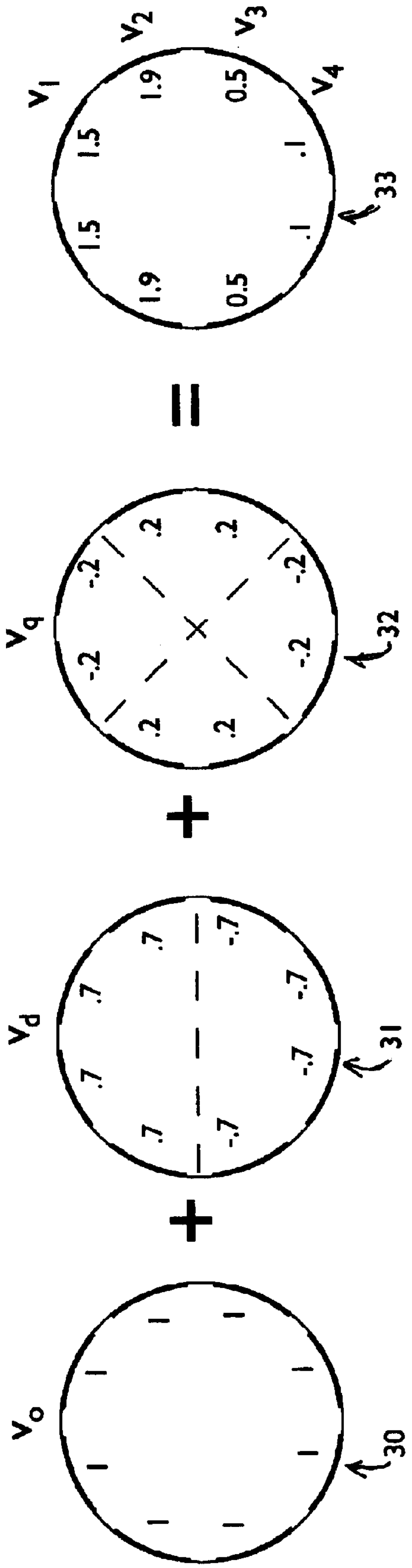
FIG. 7 shows the scheme for modal addition.

The voltage distribution for the beam pattern of FIG. 4C can be obtained through a synthesis of the transmitting responses of FIG. 5. The input voltages for each of the transmitting responses are first adjusted to yield the same pressure amplitude and phase at each frequency within the band of interest. These voltages for each mode are then multiplied by the weighting factors, 1, A, B for the desired beam pattern. The case for minimalist super cardioid with weighting factors 1, 1, 0.414 is illustrated in FIG. 7. In this example there is shown the summing of 1.0 volts for the omni mode (circle 30), 0.7 volts for the dipole mode (circle 31), and −0.2 volts for the quadrupole mode (circle 32) with the resulting summed circle 33 voltage distribution for the eight electrodes. Operating between the dipole and quadrupole modes, or between other pairs of modes avoids large phase shifts at the resonant frequencies allowing a simple single voltage distribution over the band between the two corresponding resonant frequencies of the modes. Beam steering is achieved by incrementing the entire voltage distribution by one electrode.

Figure 8:
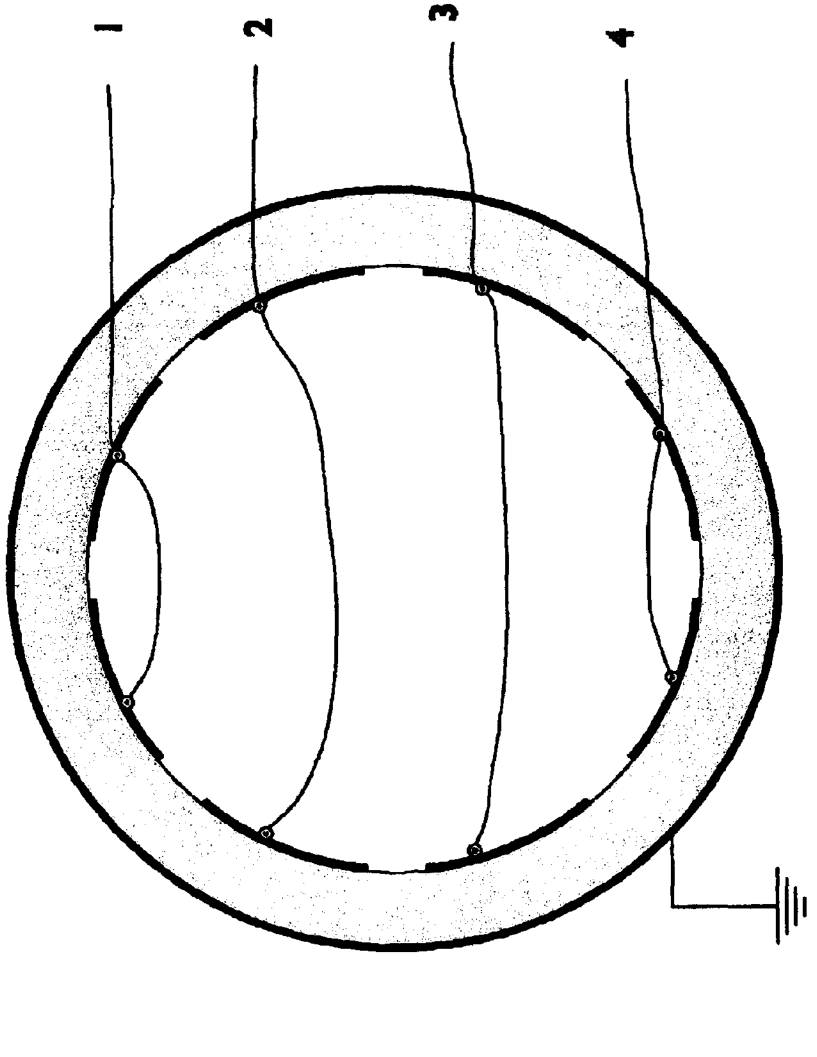
FIG. 8 shows a wiring diagram for a cylinder with eight electrodes.

The three-mode synthesis for the symmetrical voltage distribution $V_1$, $V_2$, $V_3$ and $V_4$ of FIG. 8 may be written in an algebraic form as $$V_o+V_d+V_q=V_1$$

$$V_o+V_d-V_q=V_2$$

$$V_o-V_d-V_q=V_3$$

$$V_o-V_d+V_q=V_4$$

Where $V_o$ is the required voltage for the omni mode, $V_d$ is the required voltage for the dipole mode and $V_q$ is the required voltage of the quadrupole mode to achieve a desired beam pattern. The above equation set may be generalized for more than three modes and more than eight electrodes. With the choice of operating between the dipole and quadrupole modes, large phase shifts at the resonant frequencies are avoided allowing the possibility of a simple voltage distribution over the band between the two resonant frequencies. Beam steering is achieved by incrementing the entire voltage distribution by one electrode.

An experimental coaxial transducer array with three 31 mode piezoelectric rings each 2 inches high and 4.25 inches outer diameter and 0.19 inch wall was used to validate this process. Eight electrode surfaces as in FIG. 1A were used and wired together as shown in FIG. 8 and operated in the 31 mode. The omni mode resonance is at 10 kHz, dipole at 14 kHz and the quadrupole at 22 kHz. An initial wiring scheme is illustrated in FIG. 8 along with a table illustrating drive voltages for the omni, dipole and quad modes as well as optimum voltages for minimalist super cardiod beam pattern. The actual derived real and imaginary voltages at 15, 17.5 and 20 kHz are shown in FIG. 9. As seen, the imaginary parts are comparatively small and that a simple voltage distribution, as listed under optimal, is sufficient for the frequency band between the dipole and quad modes.

Figure 10:
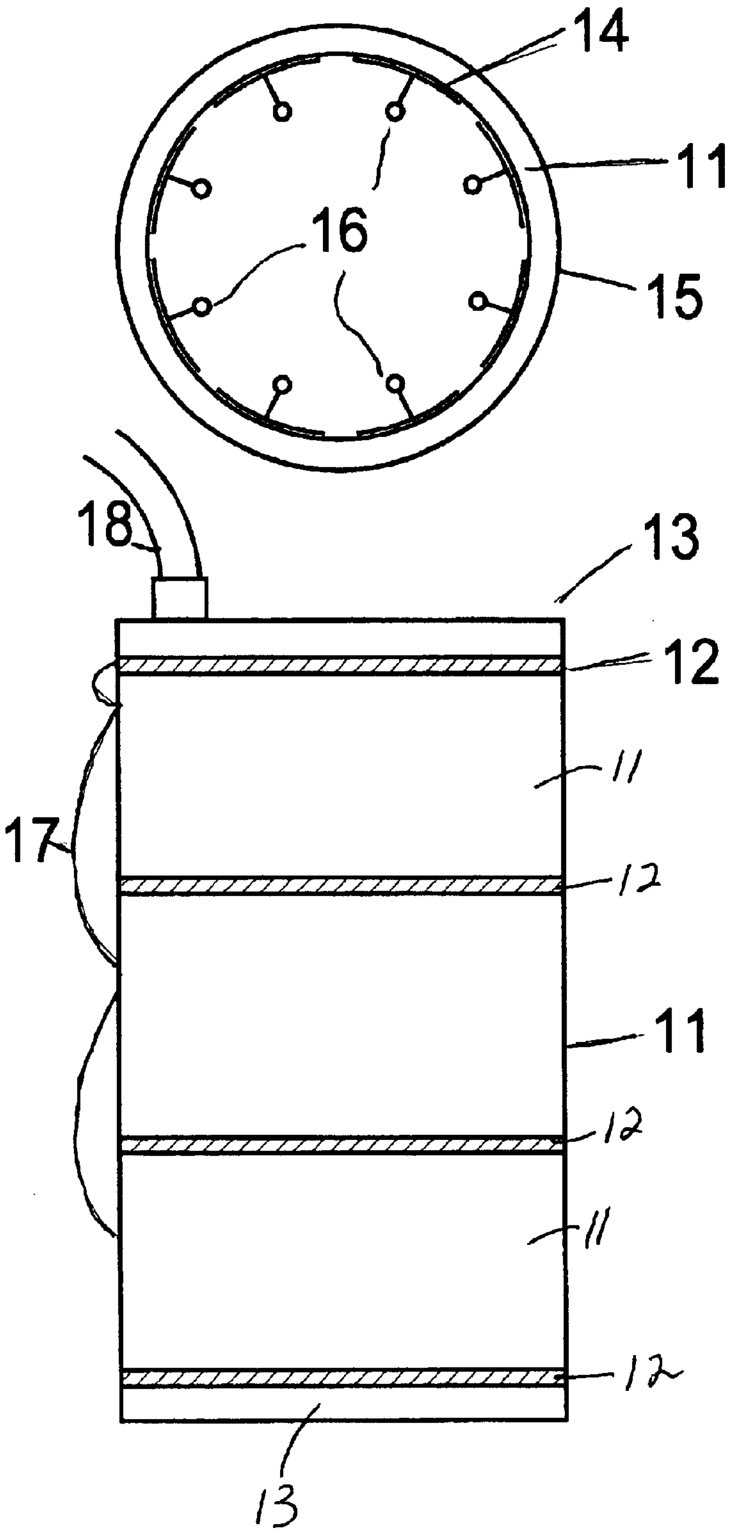
FIG. 10 shows a construction for the transducer with three piezoelectric cylinders, eight interior electrodes, one exterior electrode, four isolation rings, and two metal end caps.

The transducer construction is shown in FIG. 10 with the three 31 mode piezoelectric cylinders 11, four rubber isolation rings 12, two aluminum end caps 13, one outer electrode 15, eight interior electrodes 14, eight electrical connections 16, (all three cylinders are wired in parallel), outside electrical connections 17, and nine conductor cable 18. Although not shown, the entire unit is potted in polyurethane to prevent water ingression into the inner cavity and to electrically insulate the transducer from the water. Space is available in the inner cavity for associated electronics.

The unit was tested with a transformer with tap ratios according to the optimal values of FIG. 9 and also with a set of four amplifiers with gain adjustment according to the values of FIG. 9. Measured beam pattern results and transmitting response agreed with theory and a finite element model and the desired 90° beam pattern and smooth response was achieved. The transducer was also steered in 45° increments by separately energizing each electrode and incrementing the optimal electrical distribution by 45°. The process may be used over a wider band of frequencies but a different distribution may be necessary at each frequency rather the simple optimal case shown in FIG. 9. The three cylinders shown in FIG. 10 are preferably wired together, in parallel, and function as one long cylinder. This is preferred over the use of one single long cylinder.

The process may be applied to more than three modes and the beam pattern function may be generalized and written as $$P(\theta)=[\Sigma A_n \cos(n\theta)]/\Sigma A_n \quad \text{Eq. (2)}$$

Where $A_n$ is the weighting coefficient of the $n^{th}$ mode and n=0 corresponds to the omni mode. With the modal transmitting response $T_n=p_n/v_n$ where $p_n$ is the modal pressure and $v_n$ is the modal voltage we set $A_n=P_n/P_0=T_n v_n/T_0 v_0$ and for a 1 volt omni voltage we get that the transducer modal voltages $v_n=A_n T_0/T_n$ for desired beam pattern weighting factors, $A_n$. Since all modal pressures are now adjusted to be the same or approximately the same over a band of frequencies, the combined beam patterns and the response will also be the same at all frequencies. Also, since Eq. (2) is a Fourier series, the coefficients $A_n$ can be determined for any desired even pattern by a Fourier cosine transform of Eq. (2); that is the normalized coefficient may be determined from:

$$A_n/\Sigma A_n=(2/\pi)\int P(\theta)\cos(n\theta)d\theta \qquad \text{Eq. (3)}$$

where the integration is from θ=0 to π. It should be pointed out that although a cosine expansion has been indicated a sine expansion or combination of the two could be used for this process.

Although our embodiments have used the extensional modes of vibration of a ring, inextensional, bending modes may also be used to obtain similar beam patterns. The process may be applied to other geometrical transducer shapes and multiple modes may be used to obtain more directional beam patterns following Eq. (2).

Furthermore, in a preferred embodiment of the invention it is desired to use the transducer at substantially all frequencies within the band between the dipole and quadrupole modes. For the exact production of a desired beam pattern, the voltage is tailored to each frequency. This can be done with an electrical processor, or as disclosed herein, a single simple "average real type" distribution can be used which works quite well for all frequencies within the band.

The following patents are also incorporated by reference, in their entirety, herein: U.S. Pat. No. 3,378,814 "Directional Transducer," Apr. 16, 1968; U.S. Pat. No. 4,326,275 "Directional Transducer" Apr. 20, 1982; U.S. Pat. No. 4,443,731 "Hybrid Piezoelectric Magnetostrictive Transducer," Apr. 17, 1996; U.S. Pat. No. 4,438,509 "Transducer with Tensioned Wire Precompression," Mar. 20, 1984; U.S. Pat. No. 4,642,802 "Elimination of Magnetic Biasing," Feb. 20, 1987; U.S. Pat. No. 4,742,499 "Flextensional Transducer," May 3, 1988; U.S. Pat. No. 4,754,441 "Directional Flextensional Transducer," Jun. 28, 1988; U.S. Pat. No. 4,845,688 "Electro-Mechanical Transduction Apparatus," Jul. 4, 1989; U.S. Pat. No. 4,864,548 "Flextensional Transducer," Sep. 5, 1989; U.S. Pat. No. 5,047,683 "Hybrid Transducer," Sep. 10, 1991; U.S. Pat. No. 5,184,332 "Multiport Underwater Sound Transducer," Feb. 2, 1993; U.S. Pat. No. 3,290,646, "Sonar Transducer," by S. L. Ehrlich and P. D. Frelich; and U.S. Pat. No. 3,732,535 to S. L. Ehrlich.

Having now described a limited number of embodiments of the present invention, it should now become apparent to those skilled in the art that numerous other embodiments and modifications thereof are contemplated as falling within the scope of the present invention as defined in the appended claims. For example, mention has been made, throughout the description, of operation between the dipole and quadrupole modes. However, the principles of the present invention also apply to operation between various other higher order modes. Also, mention has been made of the transducer being air-filled, however, in an alternate embodiment of the invention the transducer may be water-filled for free flooded operation.

What is claimed is:

1. An electro-mechanical transduction apparatus comprising: a shell structure having multiple electrodes; and a driver for exciting at least two higher order shell modes of vibration, each mode electrically driven by a predetermined voltage distribution pattern so as to operate between these respective higher order modes of vibration so as to concentrate the intensity in a desired direction.

2. An electromechanical transduction apparatus set forth in claim 1 wherein the shell structure is electrically driven to attain in-phase pressure addition in the far field.

3. An electromechanical transduction apparatus as set forth in claim 1 wherein the amplitude of the voltage drive is adjusted to achieve a particular beam pattern.

4. An electromechanical transduction apparatus as set forth in claim 1 wherein the electrodes are used to excite omni, dipole and quadrupole modes of vibration.

5. An electromechanical transduction apparatus as set forth in claim 4 wherein eight electrodes are used to excite omni, dipole and quadrupole modes of vibration.

6. An electromechanical transduction apparatus as set forth in claim 3 wherein the generated beam is steered by incrementing the electrodes or by changing the voltage distribution.

7. An electromechanical transduction apparatus as set forth in claim 3 wherein the shell structure is water-filled for free flooded operation.

8. An electromechanical transduction apparatus as set forth in claim 4 wherein the dipole and quadrupole modes of vibration each have corresponding resonant frequencies.

9. An electromechanical transduction apparatus as set forth in claim 4 wherein one voltage distribution is used at all frequencies within the band.

10. An electromechanical transduction apparatus as set forth in claim 5 wherein the voltage distribution is approximately in the ratio of 1.5, 1.9, 0.5, 0.1.

11. An electromechanical transduction apparatus as set forth in claim 1 wherein the transduction driver is at least one of piezoelectric, electrostritive, single crystal, magnetostrictive, or other electromechanical transduction material.

12. An electromechanical transduction apparatus as set forth in claim 1 wherein the shell structure is in the form of a ring, cylinder, oval, sphere or sphereoid operated in the 33 or 31 mode.

13. An electromechanical transduction apparatus as set forth in claim 12 wherein the cylinder is operated in water but air backed and caped on its ends.

14. An electromechanical transduction apparatus as set forth in claim 1 wherein extensional modes are excited.

15. An electromechanical transduction apparatus as set forth in claim 1 wherein inextensional bending modes are excited.

16. An electromechanical transduction apparatus as set forth in claim 1 wherein the radiation load is a fluid or gas.

17. A method of operating an electromechanical transduction device to provide a highly directional beam pattern, said method comprising the steps of: providing a shell structure having multiple electrodes; exciting at least two higher order shell modes of vibration, and operating between the respective resonant frequencies of the higher order modes of vibration so as to concentrate the intensity in a desired direction.

18. A method of operating an electromechanical transduction device as set forth in claim 17 wherein the step of exciting includes electrically driving by a predetermined voltage distribution pattern.

19. A method of operating an electromechanical transduction device as set forth in claim 18 wherein the voltage distribution for the beam pattern is obtained through a synthesis of the transmitting responses.

20. A method of operating an electromechanical transduction device as set forth in claim 19 wherein the input voltages for each of the transmitting responses are first adjusted to yield the same pressure amplitude and phase at each frequency within the band of interest.

21. A method of operating an electromechanical transduction device as set forth in claim 20 wherein the voltages for each mode are summed with weighting factors to yield the voltage distribution.

22. A method of operating an electromechanical transduction device as set forth in claim 21 wherein the summing is of 1 volts for the omni mode, 0.7 volts for the dipole mode, and −0.2 volt for the quadrupole mode.

23. A method of operating an electromechanical transduction device as set forth in claim 22 wherein, if the super cardioid pattern is desired, then the dipole voltage is increased by a factor 2 and the quadrupole is increased by a factor 1/0.414.

24. An electromechanical transduction apparatus comprising: a shell structure having multiple electrodes arranged in a closed electrode structure; and a driver for exciting at least two higher order shell modes of vibration, each mode electrically driven by a predetermined voltage distribution pattern, these voltages for each mode being summed with weighting factors to yield the voltage distribution.

25. An electromechanical transduction apparatus as set forth in claim 24 wherein each mode is electrically driven by the predetermined voltage distribution pattern so as to operate between the dipole and quadrupole modes of vibration so as to concentrate the intensity in a desired direction.

26. An electromechanical transduction apparatus set forth in claim 24 wherein the shell structure is electrically driven to attain in-phase pressure addition in the far field.

27. An electromechanical transduction apparatus as set forth in claim 24 wherein the amplitude of the voltage drive is adjusted to achieve a particular beam pattern.

28. An electromechanical transduction apparatus as set forth in claim 24 wherein the electrodes are used to excite omni dipole and quadrupole modes of vibration.

29. An electromechanical transduction apparatus as set forth in claim 28 wherein eight electrodes are used to excite omni, dipole and quadrupole modes of vibration.

30. An electromechanical transduction apparatus as set forth in claim 27 wherein the generated beam is steered by incrementing the electrodes or by changing the voltage distribution.

31. An electromechanical transduction apparatus as set forth in claim 24 wherein the transduction driver is at least one of piezoelectric, electrostritive, single crystal, magnetostrictive, or other electromechanical transduction material.

* * * * *